United States Patent [19]

Hsu

[11] Patent Number: 4,975,764
[45] Date of Patent: Dec. 4, 1990

[54] HIGH DENSITY BICMOS CIRCUITS AND METHODS OF MAKING SAME

[75] Inventor: Sheng T. Hsu, Lawrenceville, N.J.

[73] Assignee: David Sarnoff Research Center, Inc., Princeton, N.J.

[21] Appl. No.: 370,314

[22] Filed: Jun. 22, 1989

[51] Int. Cl.$^5$ ............................................. H01L 27/02
[52] U.S. Cl. ........................................ 357/43; 357/42; 357/48; 357/86
[58] Field of Search ....................... 357/42, 43, 48, 86

[56] References Cited

U.S. PATENT DOCUMENTS

| 4,825,274 | 4/1989 | Higuchi et al. | 357/43 |
| 4,881,119 | 11/1989 | Paxman et al. | 357/43 |
| 4,891,533 | 1/1990 | Holloway | 357/43 |

OTHER PUBLICATIONS

"0.8 μm Bi-CMOS Technology with High $f_T$ Ion-Implanted Emitter Bipolar Transistor", H. Iwai et al., *Technical Digest of the* 1987 *International Electronic Devices Meeting*, Washington, D.C., Dec. 6-9, 1987, pp. 28-31.

"A 1.0 μm N-Well CMOS/Bipolar Technology for VLSI Circuits", J. Miyamoto et al, *Technical Digest of the* 1983 *International Electronic Devices Meeting*, Washington, D.C., Dec. 5-7, 1983, pp. 63-66.

Primary Examiner—Edward J. Wojciechowicz
Attorney, Agent, or Firm—W. J. Burke

[57] ABSTRACT

The area of a BiCMOS integrated circuit is reduced by fabricating portions of the MOS transistor within the bipolar transistor. A BiCMOS integrated inverter circuit having a 35% reduction in area is disclosed.

13 Claims, 5 Drawing Sheets

HIGH DENSITY BICMOS CIRCUITS AND METHODS OF MAKING SAME

This invention was made with the support of the United States Government under contract number DLA-900-87-C-3330 awarded by the Defense Electronic Supply Center. The Government has certain rights in this invention.

This invention relates to a structure for reducing the size of a BiCMOS integrated circuit, circuits incorporating this structure and methods of making the circuits.

BACKGROUND OF THE INVENTION

BiCMOS technology combines bipolar and CMOS technologies in integrated form to provide advantages over circuit implementations using only bipolar or CMOS technology. Circuits have been constructed which combine the best features of each technology, namely the high speed associated with bipolar devices and a low power consumption associated with CMOS devices. BiCMOS technology is preferred over CMOS technology in that it provides small signal handling capacity, it is less sensitive to process fluctuation and can provide mixed analog and digital functions in the same integrated circuit. BiCMOS technology is preferred over bipolar technology because it offers the possibility of higher density circuits with lower power consumption than is typically found in bipolar circuits.

As with all integrated circuits, there is a continuing emphasis on decreasing the feature sizes and improving circuit layout to increase the density of circuits which can be implemented on a silicon substrate of a given size. There is also a continuing emphasis on simplifying the processing sequence needed to form BiCMOS circuits in order to increase the yield and reduce the cost of such circuits.

SUMMARY OF THE INVENTION

The invention is a BiCMOS circuit wherein an MOS transistor or a portion thereof is fabricated in a region of a bipolar transistor thereby significantly reducing the surface area of the circuit. More particularly, the invention is a BiCMOS circuit wherein an MOS transistor or a portion thereof is fabricated in the base region of a bipolar transistor. The invention also includes a method of making a BiCMOS integrated circuit.

DESCRIPTION OF THE PREFERRED EMBODIMENTS

Figure 1:
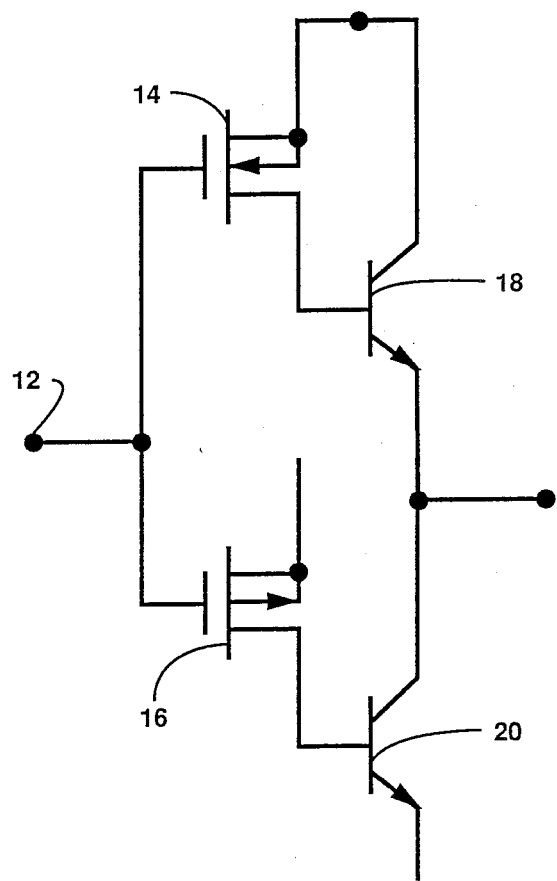
FIG. 1 is a schematic diagram of a BiCMOS inverter circuit.

In FIG. 1 an inverter circuit 10 includes an input 12 to the gates of a pMOS transistor 14 and an nMOS transistor 16. The source of the pMOS transistor 14 is electrically connected to the collector of an NPN transistor 18. The drain of pMOS transistor 14 is electrically connected to the base of NPN transistor 18. The drain of the nMOS transistor 16 is electrically connected to the emitter of NPN transistor 18 and the collector of an NPN transistor 20 to form the output of the inverter circuit 10. The source of the nMOS transistor 16 is electrically connected to the base of the NPN transistor 20 the emitter of the NPN transistor 20 is connected to ground.

Figure 2:
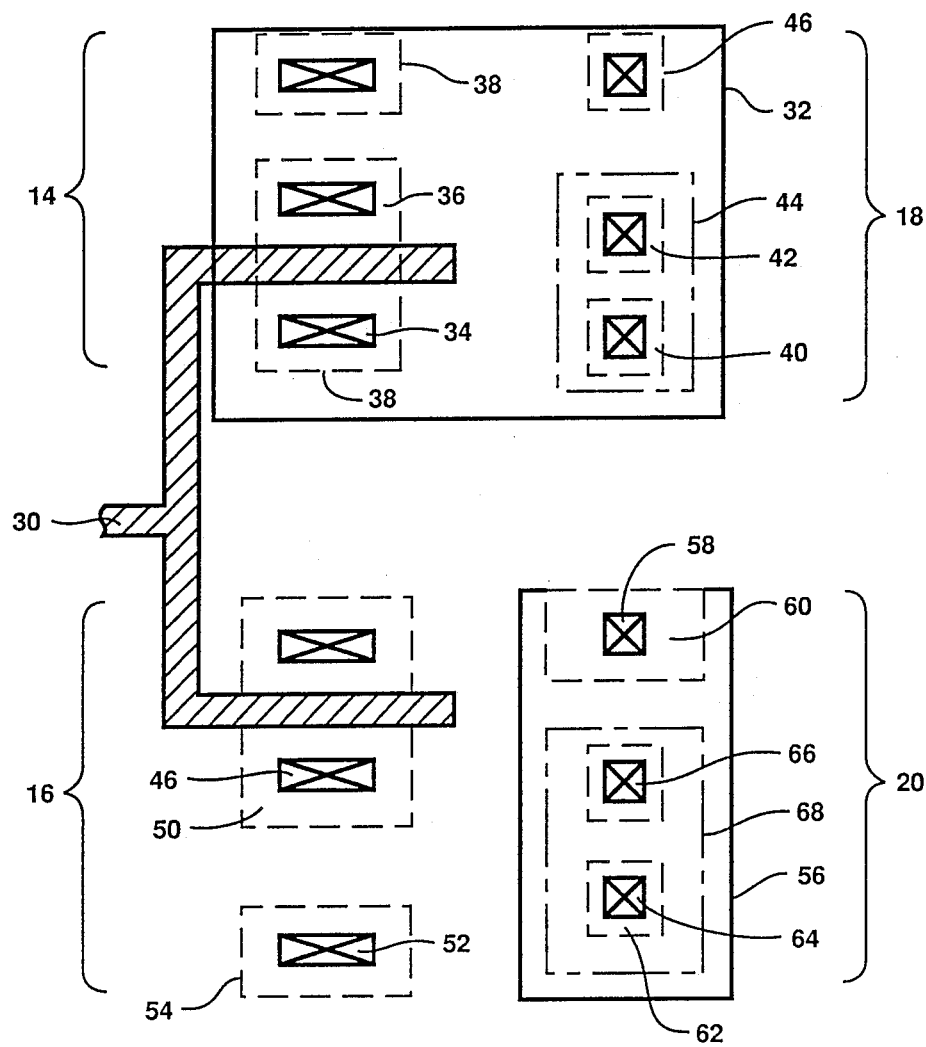
FIG. 2 is a surface view of the prior art implementation of the inverter circuit of FIG. 1.

A top view of a prior art layout of the integrated circuit embodiment at the inverter circuit 10 FIG. 1 is shown in FIG. 2. The pMOS transistor 14, the nMOS transistor 16 and their corresponding NPN transistors 18 and 20, respectively, are shown. A common gate electrode 30 serves the MOS transistors 14 and 16. The pMOS transistor 14 and the NPN transistor 18 share a common n-type collector well 32 which includes a buried collector region of the same dimensions. The p+-type drain 34 and the p+-type source 36 share a common n-type well 38. N-type well contact 38 extends down to the buried collector region in an n+-type region 38. The NPN transistor 18 comprises an n+-type emitter region 40 and a p+-type base region 42 in a p-type base region 44. The collector contact comes to the surface in an n+ type well 46. The nMOS transistor 16 includes a source 46 and a drain 48 in a p-type conductivity well 50. A p+-type substrate contact 52 comes to the surface in a p-type well 50. The NPN transistor 20 includes an n-type well 56 which provides the outline of the buried collector region. Contact 58 provides contact to the buried collector region in an n+-type well 60. An n+-type emitter 62 has a contact opening 64 and a p+-type contact 66 for a base region 68 completes the NPN transistor 20. In this view the MOS and the NPN transistors are shown separated from one another as is typical in the prior art.

Figure 3:
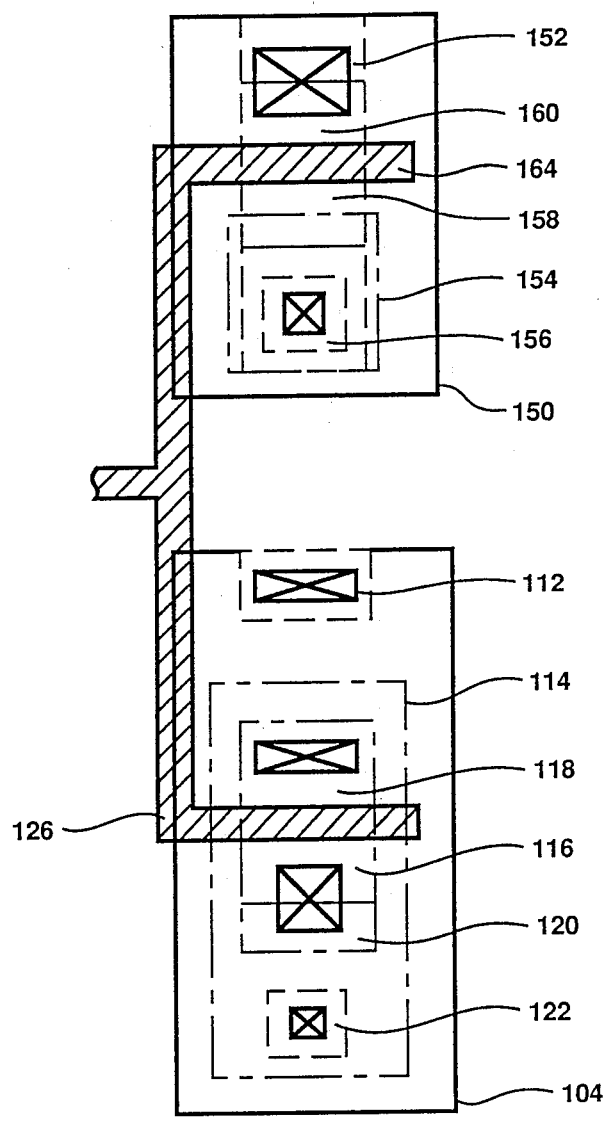
FIG. 3 is a top view of an inverter circuit according to the principles of the invention.
Figure 4:
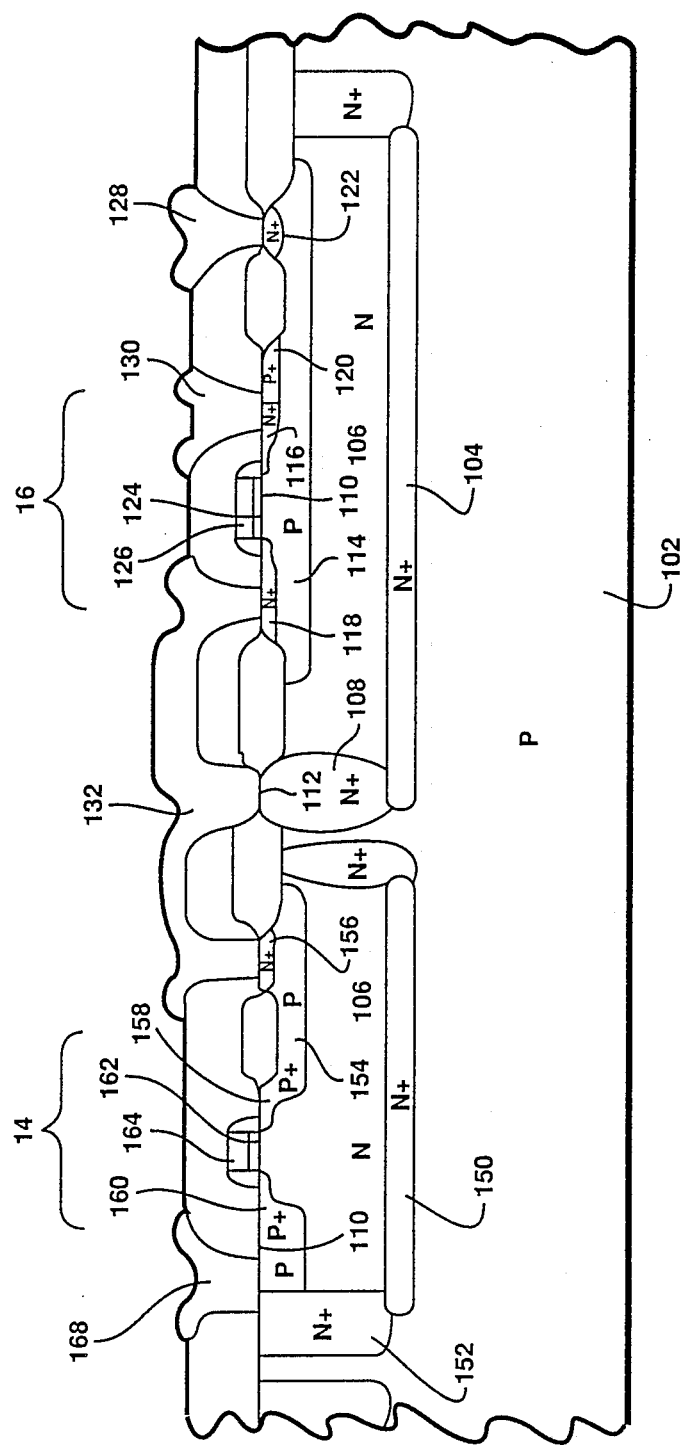
FIG. 4 is a cross sectional view of the inverter circuit of FIG. 3.

In FIGS. 3 and 4 an inverter circuit 10 of the invention is typically formed in a p−-type conductivity substrate 102 in which are formed a pMOS transistor 14, associated NPN transistor 18, a nMOS transistor 16 and an associated NPN transistor 20 of the inverter circuit 10 as shown in FIG. 1.

The location of the MOS transistors 14 and 16 are shown in the FIGURES for convenience purposes. The NPN transistor 20 comprises an n+-type buried collector layer 104, an n−-type conductivity well 106, a collector contact region 108 which extends to the surface to form the collector contact. The extent of the buried collector layer 104 is shown as the region outlined with the solid line 104 in FIG. 3. The p-type conductivity base region 114, extends a distance into the well 106 from the surface 110. N+-type conductivity source and drain regions 116 and 118, respectively, of the MOS transistor 16 are spaced apart from another and extend a distance into the base region 114 from the surface 110. A p+ type conductivity base contact region 120 is adjacent to the source region 116. An emitter region 122 extends a distance into the base region 114 from the surface 110 and is shown as spaced apart from a base contact region 120. Gate oxide layer 124 overlies a portion of the surface 110 between the source and drain region 116 and 118, respectively. A gate electrode 126, typically formed of polysilicon, is over the gate oxide layer 124. Electrical contact is made to the emitter 122 via an emitter contact 128. A common electrical contact between the base of transistor 20 and the source 116 of the MOS transistor 16 is formed by the electrical contact 130. An electrical connection between the drain 118 of the transistor 16 and the collector 108 of the NPN transistor 20 is formed by an electrical connection 132.

The NPN transistor 18 comprises a buried collector layer 150. a collector contact region 152 which extends to the surface 110 of the well 106, a p-type base region 154 which extends a distance into the n⁻ type well 106 from the surface 110 and an n⁺ type conductivity emitter region 156 which extends into the base region 154 a distance from the surface 110.

The pMOS transistor 14 comprises a drain region 158 which is an extension of a p-type base region 154, a p-type source region 160 which extends a distance into the well 106 from the surface 110, and a gate oxide 162 overlying a portion of the surface between the spaced apart drain and source regions 158 and 160, respectively, and the gate electrode 164 which overlies the gate oxide 162. The electrical circuit is completed by an electrical contact 166 to the emitter region 156, formed in an opening in the oxide coating, and a common electrical contact 168 to the region 160 and the collector contact region 152.

Figure 5:
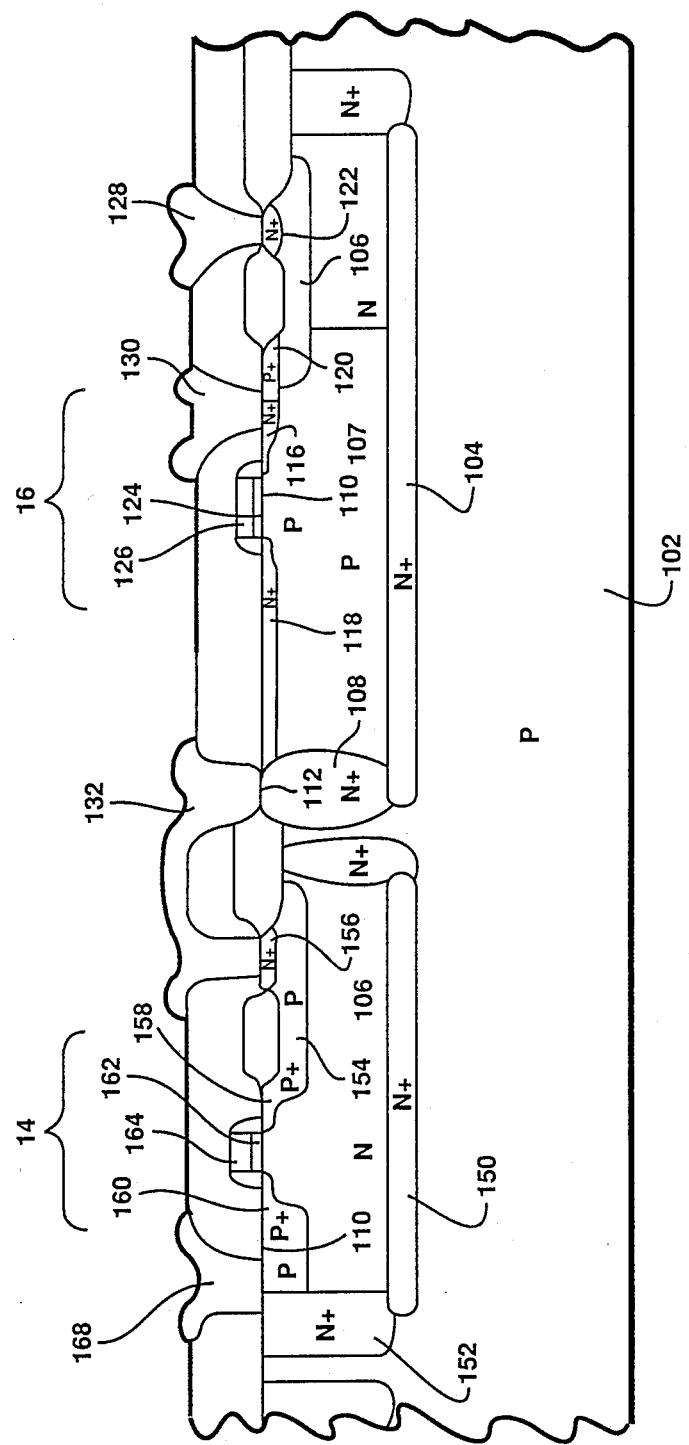
FIG. 5 is a cross sectional view of a second embodiment of an inverter circuit of the invention.

FIG. 5 a second embodiment of an inverter circuit of the invention differs from the embodiment of FIG. 4 in that the n-type well 106 of FIG. 4 in which the nMOS transistor 16 and the NPN transistor 20 are formed is divided into an n-type well 106a in which the NPN transistor 20 is formed and a p-type well 107 in which the nMOS transistor 16 is formed. The p-type base region 114 and the p-type well 107 overlap and are then common to one another; effectively extending the base region to the collector region. This midification permits the n⁺-type drain region 118 to overlap and be connected directly to the collector contact region 112, thereby eliminating the need for a direct electrical contact to the n⁺-type drain region 118. The addition of the p-type well 107 thus reduces the number of required electrical contacts to the semiconductor material.

FIGS. 4 and 5 also show numerous oxide isolation and passivation layers, whose functions and methods of formation are well known in the art, overlying the surface 110. The gate electrodes are typically formed of polysilicon but may alternatively be formed of another material such as polycide. The electrical contacts may be formed of aluminum.

By incorporating the MOS transistors of the inverter into the base regions of the NPN transistors to which they are electrically connected, the surface area required to form the inverter is significantly reduced. I estimate that, using 2 micron design rules, the surface area required for the inverter circuit of FIG. 1 is reduced from approximately 2100 square micrometers to about 1360 square micrometers, a 35% reduction in the area.

The fabrication process for the inverter circuit of the invention may be as follows:

(1) a starting material is typically p-type silicon having a resistivity between about 0.1 and 10 ohm-cm.

(2) the buried collector regions 104 and 150 are typically formed by ion implantation of antimony within an energy between about 80 and 200 keV to a dose between about 0.05 and $1.0 \times 10^{15}$ /cm².

(3) n⁻ or p⁻ conductivity epitaxial layers are typically 1.5-2 μm thick, have a resistivity between about 1 and 10 ohm-cm and are deposited by chemical vapor deposition and techniques. Phosphorus and boron are implanted and diffused to form the wells.

(4) trench isolation or LOCOS oxidation techniques can be used to provide isolation of circuit elements.

(5) the p-type base region 114 and 154 are typically formed by boron ion implantation at an energy between about 60 and 130 keV to a dose between about 0.1 and $5 \times 10^{13}$ /cm².

(6) the threshold of the MOS transistor maybe adjusted by ion implantation. The nMOS transistor threshold is adjusted by boron ion implantation at an energy between about 10 and 25 keV to a dose between about 0.2 and $1.0 \times 10^{13}$ /cm². The pMOS threshold voltage can be adjusted by phosphorous ion implantation at an energy between about 150 and 180 keV to a ose between about 0.5 and $5.0 \times 10^{12}$ /cm² followed by a boron ion implantation comparable to that used for nMOS transistors. The dose and energy for these compensations depends upon the channel length and the gate electrode material. The phosphorus implantation may not be required if the pMOS gate electrode is p⁺-type polysilicon or polycide or a refractory metal.

(7) Gate oxides are formed by thermal growth to a thickness between about 5 and 20 nm depending upon the channel length of the device.

(8) The gate electrode is typically formed of polysilicon or other material deposited by chemical vapor deposition. The polysilicon gate electrode may be doped prior to or simultaneously with the silicon drain ion implantations.

(9) lightly doped or doubly diffused structures may be used to form the source and drain regions of the MOS transistors.

(10) Source and drain regions are formed by ion implantation; anf n⁺ ion implantation of arsenic is typically performed at an energy between about 30 and 150 keV to a dose between about 1 and $8 \times 10^{15}$ /cm² and a p⁺ ion implantation of boron is typically performed at an energy between about 10 and 50 keV to a dose between about 1 and $8 \times 10^{15}$ /cm².

(11) The metalizations are typically formed by first depositing between about 400 and 600 nm of phosphosilicate or borophosphosilicate glass followed by a plasma etching step to define the openings. After deposition of the metal the plasma etch step is again used to pattern the metal.

(12) Passivation of the circuit is typically done using an oxide containing 2 to 4% phosphosilicate deposited by chemical vapor deposition to a thickness between 500 and 1000 nm.

While the processes described herein are commonly used in the integrated circuit art to form devices and circuits such as those described herein, other methods may also be used. Alternatively for high density applications processes disclosed by the inventor in his application DSRC 10161 entitled SELF-ALIGNED POLYSILICON EMITTER BiCMOS PROCESS filed concurrently herewith may be used.

It is to be understood that other, similar materials, such as polycide, may be used in place of polysilicon. Polycide is formed by depositing a layer of a refractory metal such as titanium or tungsten between about 200 and 500 nm thick onto a polysilicon layer. It is further understood that the conductivity types disclosed for the different layers and regions can be reversed so long as the relationship of the conductivity types for each device are maintained. It is further understood that the words electrically connected means a high electrical conductivity connection formed, for example by a metal such as aluminum or by a high conductivity semiconductor such as heavily doped polysilicon.

While the principles of the invention have been disclosed by their embodiment in an inverter circuit, these principles can also be used in other BiCMOS circuits where an element of the MOS transistor is electrically connected to an element of the bipolar transistor. In general, a BiCMOS integrated circuit comprises an MOS transistor, having a gate and source and drain regions in a semiconductor layer, and a bipolar transistor, having emitter, collector and base transistor regions in a semiconductor layer, with at least one of the source and drain regions being electrically connected to one of the transistor regions. The improvement comprises at least one of the source and drain regions being within one of the transistor regions; in particular, at least one of the source and drain regions being within the transistor base region; and more particularly both the source and drain regions being within the transistor base region.

The invention is also an improved method of forming a BiCMOS integrated circuit, wherein the circuit comprises an MOS transistor, having a gate and source and drain regions, and a biploar transistor, having emitter, collector and base transistor regions, wherein one of the source and drain regions is electrically connected to a transistor region; the different MOS and bipolar transistor regions being formed by adding conductivity modifiers of the appropriate type to particular regions of a semiconductor material. The method comprises forming at least one of the source and drain regions in one of the transistor regions. In particular, the method comprises at least one of the source and drain regions being formed in the transistor base region and, more particularly, the method comprises forming the source and drain regions of the MOS transistor in the transistor base region.

I claim:

1. An integrated circuit comprising:
    a first layer of first conductivity type;
    a collector region of opposite conductivity type spaced a distance from and extending substantially parallel to a first surface of said first layer;
    a collector contact region of opposite conductivity type extending from said collector region to said first surface;
    a well region extending from said collector region to said first surface;
    a base region of first conductivity type extending into said well region a distance from said first surface;
    an emitter region of opposite conductivity type extending a distance into said base region from said first surface;
    a base contacting region of first conductivity type and of higher conductivity than the base region extending into said base region from said first surface;
    a drain region of opposite conductivity type extending into said base region a distance from said first surface adjacent to said base contact region and electrically connected to said base contact region;
    a source region of opposite conductivity type extending a distance into said base region from said first surface and spaced apart from said drain region along said first surface;
    said source and drain regions each having an area at said first surface smaller than the area of the base region so that each is completely within the base region; and
    a gate electrode overlaying the portion of said first surface between said source and drain regions,
    wherein said emitter region, said base region and said collector region form a bipolar transistor and said source and drain regions and said gate electrode form an MOS transistor.

2. The integrated circuit of claim 1 wherein said well region is of opposite conductivity type.

3. The integrated circuit of claim 2 further comprising a gate oxide layer positioned between said gate electrode and said first surface.

4. The integrated circuit of claim 3 wherein said first conductivity type is p-type ans said opposite conductivity type is n-type.

5. The integrated circuit of claim 4 further comprising and electrical connection extending between said collector contact region and said source region.

6. The integrated circuit of claim 5 further comprising an oxide layer over an isolation layer overlying said surface between said source region and said collector contact region and said electrical connection between said collector contact and said source region overlying said isolation region.

7. The integrated circuit of claim 1 wherein said well region comprises an opposite conductivity type first portion extending from said collector region to said base region and a first conductivity type second portion extending from said collector region to said base region and said source region overlaps said collector contact region.

8. The integrated circuit of claim 7 further comprising a gate oxide layer positioned between said gate electrode and said first surface.

9. The integrated circuit of claim 8 wherein said first conductivity type is p-type and said opposite conductivity type is n-type.

10. The integrated circuit of claim 1 further comprising: a second collector region of opposite conductivity type spaced a distance from and extending substantially parallel from the surface of said first layer and spaced apart from said collector region
    a second collector region extending from said second collector region to said surface;
    a second well region opposite conductivity type extending from said collector region to said first surface;
    a second base region of first conductivity type extending a distance into said second well region a distance from said surface towards said second collector region;
    a second emitter region of opposite conductivity type extending a distance into said second base region from said first surface;
    a second source region extending a distance into said well region from said first surface and spaced apart from said second base region;
    a second gate electrode overlying the portion of said first surface between said second base region and said second source region; and
    siad second source ,region and said second collector contact region being electriclly connected to one another;
    wherein. said gate electrode and said second gate electrode are electrically connected with one another; and
    wherein, a portion of said second base region forms the drain of an MOS transistor togehter with said second gate electrode and said second source region.

11. The integrated circuit of claim 10 wherein the first conductivity type is p-type and the opposite conductivity type is n-type.

12. The integrated circuit of claim 11 wherein an electrically insulating layer is interposed between the first surface and the second gate electrode.

13. The integrated circuit of claim 9 further comprising an electrical isolation layer extending along said surface between said second emitter region and said second drain region.

* * * * *